(12) United States Patent
Yan et al.

(10) Patent No.: US 12,717,449 B2
(45) Date of Patent: Aug. 25, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jun Yan, Beijing (CN); Kemeng Tong, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/853,039

(22) PCT Filed: Jan. 23, 2024

(86) PCT No.: PCT/CN2024/073573
§ 371 (c)(1),
(2) Date: Sep. 30, 2024

(87) PCT Pub. No.: WO2024/174789
PCT Pub. Date: Aug. 29, 2024

(65) Prior Publication Data

US 2025/0370573 A1 Dec. 4, 2025

(30) Foreign Application Priority Data

Feb. 24, 2023 (CN) ......................... 202310195505.7

(51) Int. Cl.
*G06F 3/044* (2006.01)
*H10K 59/122* (2023.01)
*H10K 59/40* (2023.01)

(52) U.S. Cl.
CPC .......... *G06F 3/0443* (2019.05); *G06F 3/0446* (2019.05); *H10K 59/122* (2023.02); *H10K 59/40* (2023.02)

(58) Field of Classification Search
None
See application file for complete search history.

(56) References Cited

U.S. PATENT DOCUMENTS 11,157,102 B2 * 10/2021 Lee .......................... G06F 3/047
2024/0061524 A1 * 2/2024 Lee ........................ G06F 3/0412
2025/0216994 A1 * 7/2025 Zhang ................... G06F 3/0446

FOREIGN PATENT DOCUMENTS

CN 105448385 A * 3/2016
CN 106816460 A * 6/2017 ........... G06F 3/0412
(Continued)

OTHER PUBLICATIONS

CN 202310195505.7 first office action dated May 15, 2025.

*Primary Examiner* — Duane N Taylor, Jr.
(74) *Attorney, Agent, or Firm* — IPro, PLLC

(57) ABSTRACT

Disclosed is a display panel, including a driver backplane, a plurality of light-emitting devices, an encapsulation layer, a touch electrode layer, and sub-mains. The touch electrode layer is provided with a plurality of mesh holes in one-to-one correspondence with the plurality of light-emitting devices, and an orthographic projection of each of the plurality of light-emitting devices on the driver backplane falls into an orthographic projection of a corresponding mesh hole on the driver backplane; and the sub-main is distributed in the mesh hole, wherein at least one end of the sub-main is connected to an inner wall of the mesh hole, and the sub-main is provided with an auxiliary partition opening.

18 Claims, 11 Drawing Sheets

(56) References Cited

FOREIGN PATENT DOCUMENTS

| | | | | |
|---|---|---|---|---|
| CN | 108595062 | A | 9/2018 | |
| CN | 108897454 | A | 11/2018 | |
| CN | 113471384 | A | * 10/2021 | ............ H10K 59/12 |
| CN | 114361226 | A | 4/2022 | |
| CN | 115047988 | A | 9/2022 | |
| CN | 116193932 | A | 5/2023 | |
| JP | 2017004519 | A | 1/2017 | |
| KR | 20180085227 | A | 7/2018 | |
| KR | 20230024479 | A | 2/2023 | |

* cited by examiner

F

G

DISPLAY PANEL AND DISPLAY DEVICE

This present disclosure is a U.S. national phase application based on PCT/CN2024/073573, filed on Jan. 23, 2024, which is based on and claims priority to Chinese Patent Application No. 202310195505.7 filed on Feb. 24, 2023, entitled "DISPLAY PANEL AND DISPLAY DEVICE," all of which are hereby incorporated by reference in their entireties for all purposes.

TECHNICAL FIELD

The present disclosure relates to the field of display technologies, and in particular, relates to a display panel and a display device.

BACKGROUND

With the development of display technologies, more and more display devices have touch functions, and users can interact with the display devices by touch.

SUMMARY

Embodiments of the present disclosure provide a display panel and a display device, which can solve the problem of poor reliability of display panels in the related art. The technical solution is as follows.

In one aspect, a display panel is provided, including:

a driver backplane;

a plurality of light-emitting devices disposed in an array on a side of the driver backplane;

an encapsulation layer disposed on a side of the plurality of light-emitting devices facing away from the driver backplane;

a touch electrode layer disposed on a side of the encapsulation layer facing away from the driver backplane, wherein the touch electrode layer is provided with a plurality of mesh holes in one-to-one correspondence with the plurality of light-emitting devices, and an orthographic projection of each of the plurality of light-emitting devices on the driver backplane falls into an orthographic projection of a corresponding mesh hole on the driver backplane; and a sub-main distributed in at least one of the plurality of mesh holes, wherein at least one end of the sub-main is connected to an inner wall of a mesh hole in which the sub-main is disposed, and the sub-main is provided with an auxiliary partition opening.

In some embodiments, the touch electrode layer includes a plurality of first main lines extending along a first direction and a plurality of second main lines extending along a second direction, wherein the plurality of first main lines and the plurality of second main lines are configured to enclose the plurality of mesh holes, the first direction being a column arrangement direction of the plurality of light-emitting devices, and the second direction being a row arrangement direction of the plurality of light-emitting devices;

wherein a width of an orthographic projection of each mesh hole distributed with the sub-main on the driver backplane in the first direction is greater than a width of the orthographic projection of each mesh hole distributed with the sub-main on the driver backplane in the second direction, and an extension direction of the sub-main is parallel to an extension direction of each of the second main lines.

In some embodiments, at least one of the second main lines and at least one sub-main are distributed between two adjacent light-emitting devices in the first direction.

In some embodiments, two sub-mains disposed side by side are distributed between the two adjacent light-emitting devices in the first direction, and the at least one of the second main lines distributed between the two adjacent light-emitting devices are disposed between the two sub-mains disposed side by side.

In some embodiments, in the two sub-mains disposed side by side, a position of an auxiliary partition opening in one of the two sub-mains is staggered with a position of an auxiliary partition opening in the other one of the two sub-mains in the first direction.

In some embodiments, the plurality of light-emitting devices includes a plurality of first-type light-emitting devices and a plurality of second-type light-emitting devices, and the plurality of mesh holes includes first-type mesh holes corresponding to the first-type light-emitting devices and second-type mesh holes corresponding to the second-type light-emitting devices;

wherein a ratio of an area of an orthographic projection of each of the first-type light-emitting devices on the driver backplane to an area of an orthographic projection of a corresponding first-type mesh hole on the driver backplane, is greater than a ratio of an area of an orthographic projection of each of the second-type light-emitting devices on the driver backplane to an area of an orthographic projection of a corresponding second-type mesh hole on the driver backplane; and the sub-main is distributed in at least one of the first-type mesh holes.

In some embodiments, a plurality of first-type light-emitting devices in a row of the first-type light-emitting devices are distributed at equal intervals, and in the first direction, at least one of the second main lines and at least one sub-main are distributed between every two adjacent first-type light-emitting devices; or, in a row of the first-type light-emitting devices, a distance between a first sub-light-emitting device and a second sub-light-emitting device is greater than a distance between the first sub-light-emitting device and a third sub-light-emitting device, the first sub-light-emitting device being any one of the first-type light-emitting devices in the row of the first-type light-emitting devices, and the second sub-light-emitting device and the third sub-light-emitting device in the row of the first-type light-emitting devices being two first-type light-emitting devices adjacent to the first sub-light emitting device: and in the first direction, at least one of the second main lines and at least one sub-main are distributed between the first sub-light-emitting device and the second sub-light-emitting device, and one of the second main lines is distributed between the second sub-light-emitting device and the third sub-light-emitting device.

In some embodiments, in the case that one second main line and one sub-main are distributed between two adjacent first-type light-emitting devices in the first direction, a second main line between the two adjacent the first-type light-emitting devices in the first direction is staggered with a second main line between two adjacent second-type light-emitting devices, and a distance between the second main line between the two adjacent the first-type light-emitting devices and the second main line between the two adjacent the second-type light-emitting devices is equal to a distance between a sub-main between the two adjacent the first-type light-emitting devices and the second main line between the two adjacent the second-type light-emitting devices.

In some embodiments, in the first direction, in the case that a second main line, adjacent to the sub-main, is provided with a partition opening, a position of the partition opening of the second main line is staggered with a position of an auxiliary partition opening of the sub-main.

In some embodiments, the first main lines, the second main lines, and the sub-main are arranged in a same layer and made of a same material.

In some embodiments, the touch electrode layer includes a plurality of touch driving electrodes and a plurality of touch sensing electrodes, wherein each of the touch driving electrodes and the touch sensing electrodes includes a portion of the first main lines and a portion of the second main lines, and the touch driving electrodes and the touch sensing electrodes which are adjacently arranged are disconnected through partition openings of the first main lines and/or partition openings of the second main lines.

In some embodiments, the touch electrode layer further includes: a first virtual electrode disposed between the touch driving electrode and the touch sensing electrode which are adjacently arranged, wherein the first virtual electrode includes a portion of the first main line and a portion of the second main line, and the first virtual electrode is disconnected to the touch driving electrode through the partition openings of the first main lines and/or the partition openings of the second main lines, and the first virtual electrode is disconnected to the touch sensing electrode through the partition openings of the first main lines and/or the partition openings of the second main lines.

In some embodiments, each touch electrode in the touch driving electrodes and the touch sensing electrodes has an isolation region, and the touch electrodes layer further includes a second virtual electrode disposed in the isolation region, wherein the second virtual electrode includes a portion of the first main lines and a portion of the second main lines, and the second virtual electrode is disconnected to the touch electrode through the partition openings of the first main lines and/or the partition openings of the second main lines.

In some embodiments, the display panel further includes: a pixel definition layer disposed on a side of the driver backplane, wherein the pixel definition layer is provided with a plurality of pixel openings in one-to-one correspondence with the plurality of light-emitting devices, each of the light-emitting devices being disposed in a corresponding pixel opening;

wherein both an orthographic projection of the touch electrode layer on the driver backplane and an orthographic projection of the sub-main on the driver backplane fall into an orthographic projection of the pixel definition layer on the driver backplane.

In another aspect, a display device is provided. The display device includes a power supply assembly, and a display panel electrically connected to the power supply assembly, wherein the display panel includes the display panel as described above.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description illustrate merely some embodiments of the present disclosure, and persons of ordinary skill in the art may still derive other drawings from these accompanying drawings without creative efforts.

DETAILED DESCRIPTION

For clearer description of the objectives, technical solutions, and advantages of the present disclosure, embodiments of the present disclosure are described in detail hereafter with reference to the accompanying drawings.

Figure 1:
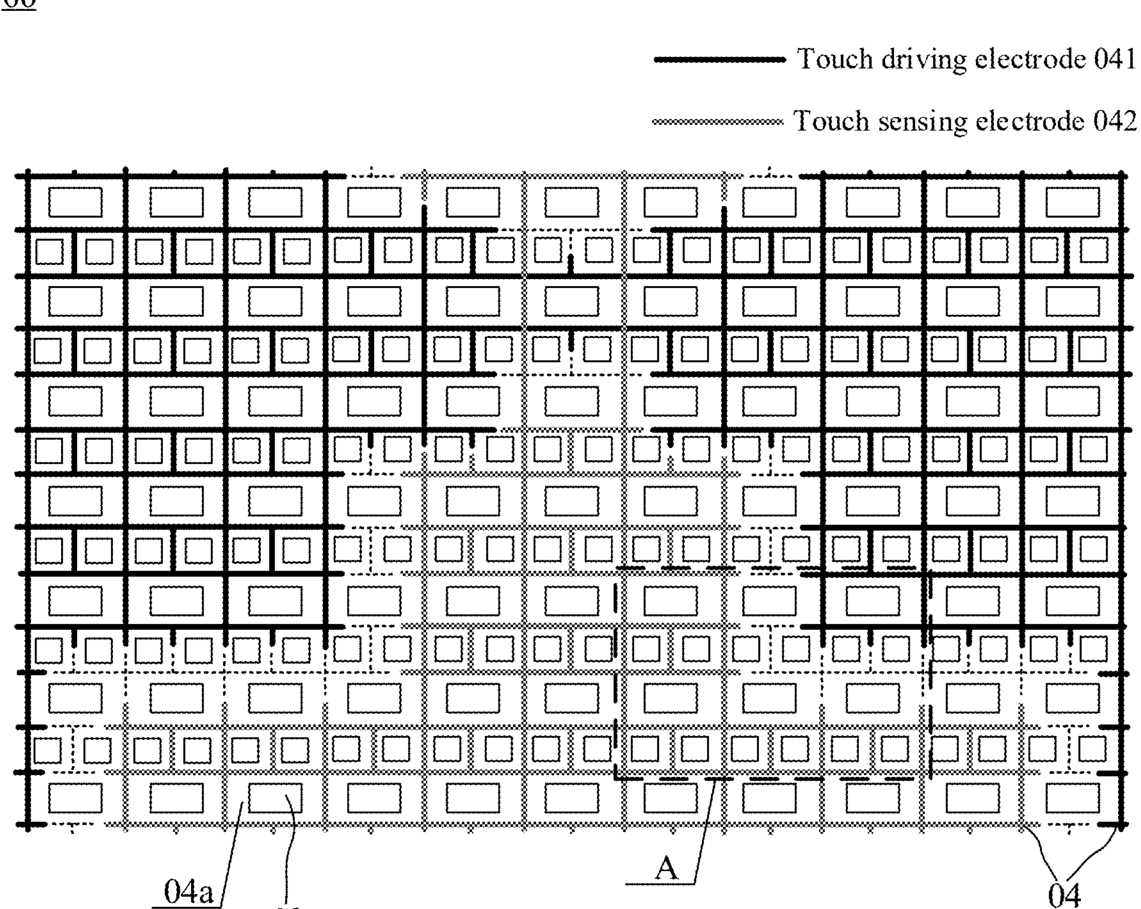
FIG. 1 is a partial top view of a common used display panel.
Figure 2:
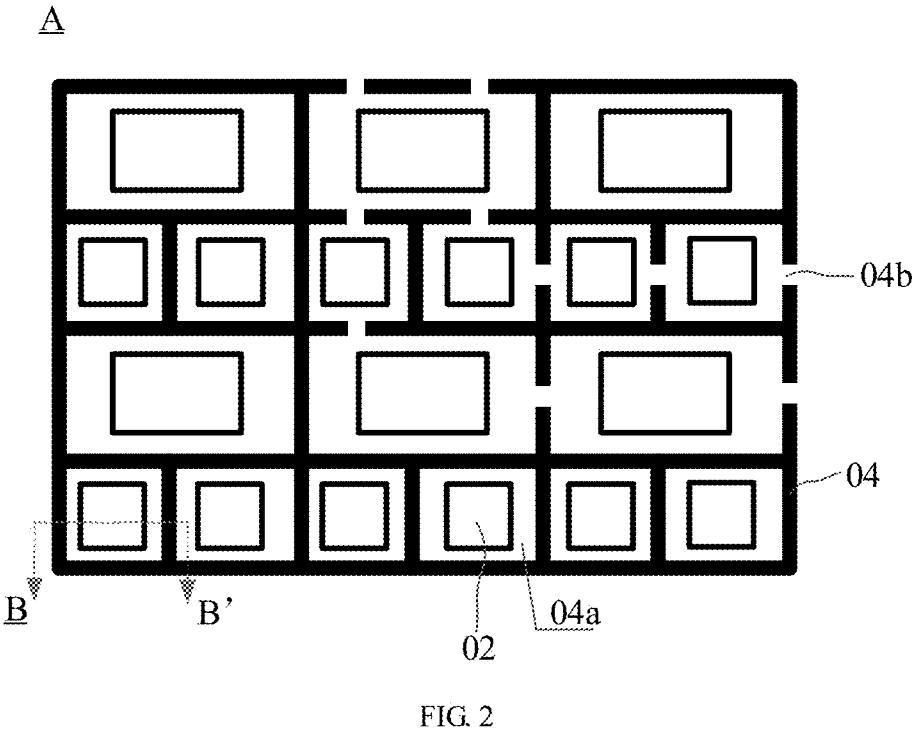
FIG. 2 is a partial enlarged view of the display panel at position A shown in FIG. 1.
Figure 3:
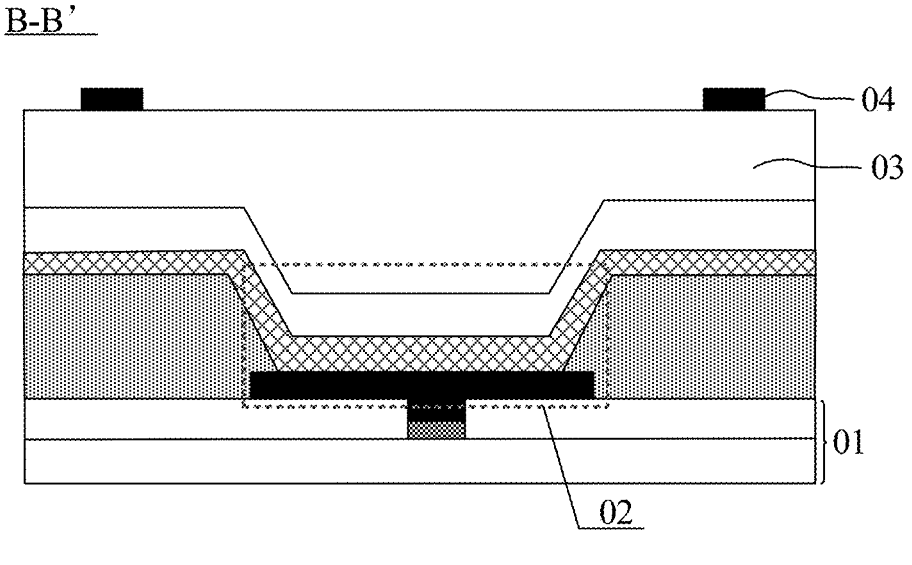
FIG. 3 is a schematic diagram of a film layer structure of the display panel at position B-B' shown in FIG. 2.

Referring to FIGS. 1, 2, and 3, FIG. 1 is a partial top view of a common used display panel, FIG. 2 is a partial enlarged view of the display panel at position A shown shown in FIG. 1, and FIG. 3 is a schematic diagram of a film layer structure of the display panel at position B-B' shown in FIG. 2. The display panel 00 may include a driver backplane 01, a plurality of light-emitting devices 02 disposed on a side of the driver backplane, an encapsulation layer 03 for encapsulating the plurality of light-emitting devices 02, and a touch electrode layer 04 disposed on a side of the encapsulation layer 03 facing away from the driver backplane 01.

Here, the touch electrode layer 04 is usually a mesh-shaped metal electrode layer. That is, the touch electrode layer 04 has a plurality of mesh holes 04*a*, and the plurality of mesh holes 04*a* may be in one-to-one correspondence with the plurality of light-emitting devices 02, and an orthographic projection of each of the plurality of light-emitting devices 02 on the driver backplane 01 may fall into an orthographic projection of the corresponding mesh hole 04*a* on the driver backplane 01.

The touch electrode layer 04 may generally include a plurality of touch driving electrodes 041 and a plurality of touch sensing electrodes 042. Both the touch driving electrodes 041 and the touch sensing electrodes 042 may be provided with mesh holes 04*a*, and the touch driving electrodes 041 and the touch sensing electrodes 042 are arranged in the same layer and made of the same material. In order to ensure that there is no short circuit between the touch driving electrodes 041 and the touch sensing electrodes 042, a plurality of partition openings 04*b* need to be arranged between the touch driving electrodes 041 and the touch sensing electrodes 042.

However, as the touch electrode layer 04 is made of metal material, the reflectivity of the touch electrode layer 04 to the ambient light is usually high, and the reflectivity of the partition openings 04*b* provided in the touch electrode layer 04 to the ambient light is low. Therefore, when the touch driving electrodes 041 and the touch sensing electrodes 042 are separated by providing the partition openings 04*b* between the touch driving electrodes 041 and the touch sensing electrodes 042, when the display panel does not display an image and is irradiated by the ambient light, mesh-shaped dark lines may appear on the display panel 00. The mesh-shaped dark lines are mainly distributed between the touch driving electrodes 041 and the touch sensing electrodes 042, thereby resulting in lower reliability of the display panel 00.

In the related art, in order to reduce the phenomenon of dark lines that appear when the display panel does not display an image and is irradiated by the ambient light, it is necessary to provide uniformly arranged partition openings inside the touch driving electrodes 041 and the touch sensing electrodes 042. In this way, the design will increase resistances of the touch driving electrodes 041 and resistances of the touch sensing electrodes 042, thereby causing the touch effect of the display panel 00 to deteriorate.

Figure 4:
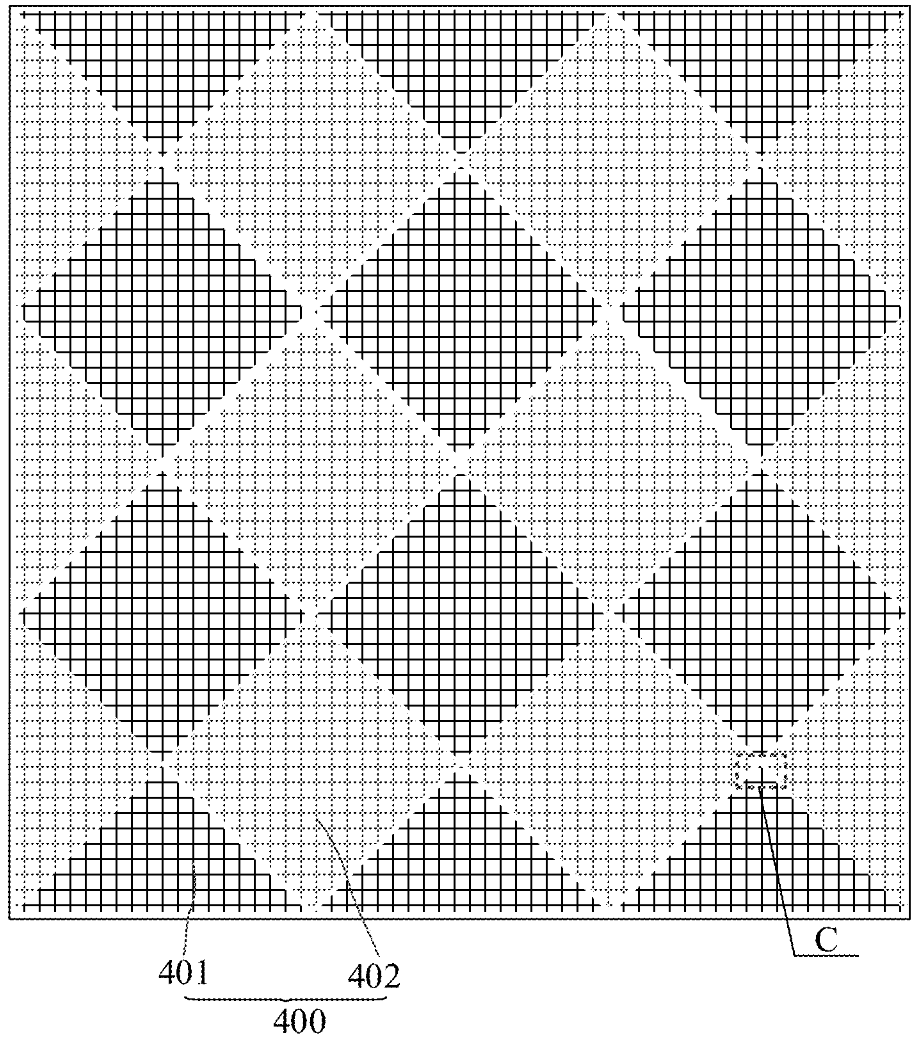
FIG. 4 is a top view of a display panel according to some embodiments of the present disclosure.
Figure 5:
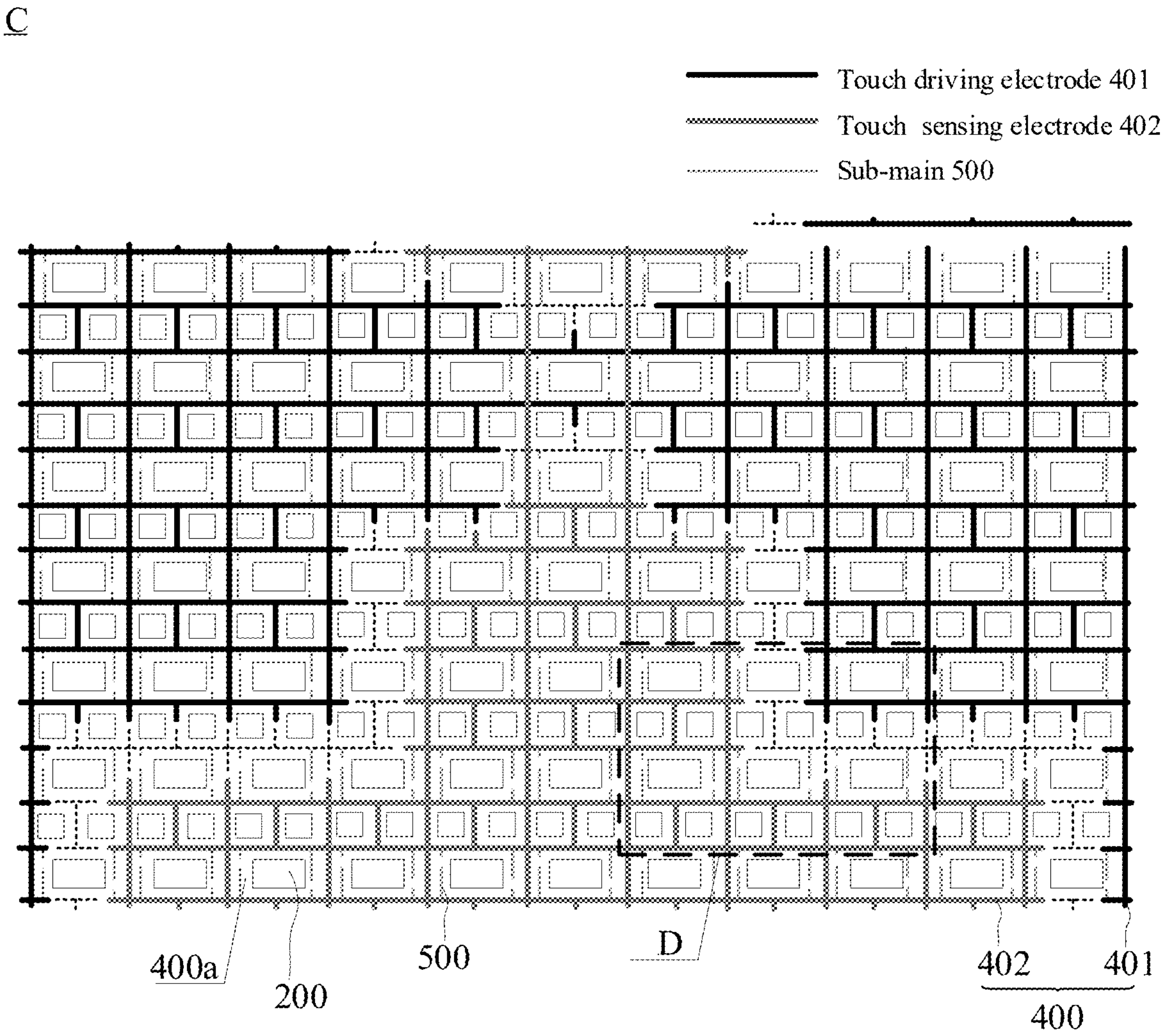
FIG. 5 is a partial enlarged view of the display panel at position C shown in FIG. 4.
Figure 6:
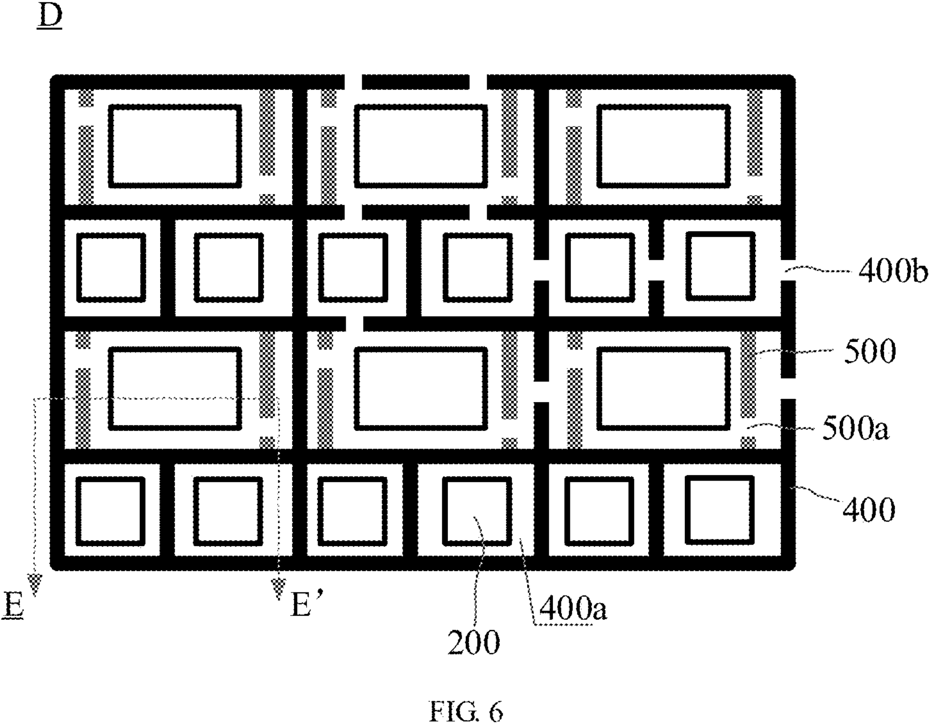
FIG. 6 is a partial enlarged view of the display panel at position D shown in FIG. 5.
Figure 7:
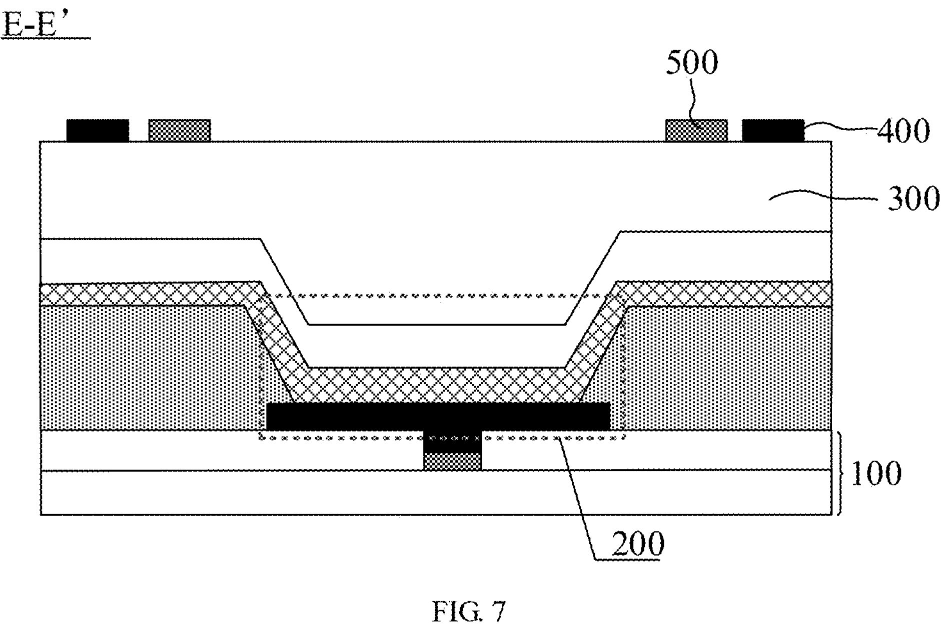
FIG. 7 is a schematic diagram of a film layer structure of the display panel at position E-E' shown in FIG. 6.

Referring to FIGS. 4 to 7, FIG. 4 is a top view of a display panel according to some embodiments of the present disclosure, FIG. 5 is a partial enlarged view of the display panel at position C shown in FIG. 4, FIG. 6 is a partial enlarged view of the display panel at position D shown in FIG. 5, and FIG. 7 is a schematic diagram of a film layer structure of the display panel at position E-E' shown in FIG. 6. The display panel 000 may include: a driver backplane 100, a plurality of light-emitting devices 200, an encapsulation layer 300, a touch electrode layer 400, and a sub-main 500.

The plurality of light-emitting devices 200 in the display panel 000 may all be disposed on a side of the driver backplane 100, and the plurality of light-emitting devices 200 are arranged in an array on the driver backplane 100. Here, each of the light-emitting devices 200 may be electrically connected to the driver backplane 100, and the driver backplane 100 may drive the light-emitting devices 200 to emit light.

The encapsulation layer 300 in the display panel 000 may be disposed on a side of the plurality of light-emitting devices 200 facing away from the driver backplane 100. Here, the encapsulation layer 300 is configured to encapsulate each of the light-emitting devices 200 to prevent water and oxygen in the external environment from eroding the light-emitting layer in the light-emitting devices 200, thereby increasing the service life of the light-emitting device 200.

The touch electrode layer 400 in the display panel 000 may be disposed on a side of the encapsulation layer 300 facing away from the driver backplane 100. Here, the touch electrode layer 400 may be a mesh-shaped metal electrode layer. For example, the touch electrode layer 400 is provided with a plurality of mesh holes 400*a* in one-to-one correspondence with the plurality of light-emitting devices 200, and an orthographic projection of each of the light-emitting devices 200 on the driver backplane 100 may fall into an orthographic projection of a corresponding mesh hole 400*a* on the driver backplane 100. That is, an orthographic projection of the touch electrode layer 400 on the driver backplane 100 does not overlap with the orthographic projection of each of the light-emitting devices 200 on the driver backplane 100. In this way, even if the material of the touch electrode layer 400 is an opaque metal material, it can be ensured that the touch electrode layer 400 will not block the light-emitting devices 200, such that the light emitted by the light-emitting devices 200 can be transmitted from the corresponding mesh holes 400*a* in the touch electrode layer 400, thereby ensuring that the display panel 000 can display an image normally.

In the present disclosure, as shown in FIG. 4, the touch electrode layer 400 may include: a plurality of touch driving electrodes 401 and a plurality of touch sensing electrodes 402. Here, through the cooperation of the touch driving electrodes 401 and the touch sensing electrodes 402, the capacitance change of a region where the user touches the display panel 000 can be detected, so as to locate the position of the touch region through the capacitance change. The touch driving electrodes 401 and the touch sensing electrodes 402 may both be provided with mesh holes 400*a*, and are arranged in the same layer and made of the same material. It is to be noted that two structures in the embodiments of the present disclosure are arranged in the same layer and made of the same material, which means that the two structures are formed by the same composition process. For example, the touch driving electrodes 401 and the touch sensing electrodes 402 are formed by a single patterning process. The single patterning process may include: photoresist coating, exposure, development, etching, and photoresist stripping.

As shown in FIG. 5 and FIG.6, in order to prevent the problem of a short circuit between the touch driving electrodes 401 and the touch sensing electrodes 402 arranged in the same layer, a plurality of partition openings 400*b* need to be arranged in the touch electrode layer 400, and the partition openings 400*b* need to be distributed between the touch driving electrodes 401 and the touch sensing electrodes 402, such that the touch driving electrodes 401 and the touch sensing electrodes 402 are separated through the partition openings 400*b*.

The sub-main 500 in the display panel 000 may be disposed in the mesh holes 400*a* of the touch electrode layer 400, at least one end of the sub-main 500 may be connected to an inner wall of each of the mesh holes 400*a*, and the sub-main 500 is provided with an auxiliary partition opening 500*a*. In one possible implementation, both ends of the sub-main 500 may be connected to the inner wall of the corresponding mesh hole 400*a*, respectively. In this case, the auxiliary partition openings 500*a* may be disposed in the sub-main 500. In another possible implementation, one end of the sub-main 500 is connected to the inner wall of the corresponding mesh hole 400*a*, and the other end of the sub-main 500 is separated from the inner wall of the mesh hole 400*a*. In this case, the auxiliary partition opening 500*a* may be disposed between the other end of the sub-main 500 and the inner wall of the corresponding mesh hole 400*a*.

It should be noted that at least a portion of the mesh holes 400*a* in the plurality of mesh holes 400*a* of the touch electrode layer 400 may be provided with the sub-main 500. Here, in one possible implementation, each of the mesh holes 400*a* in the touch electrode layer 400 is provided with the sub-main 500; in another possible implementation, a portion of the mesh holes 400*a* in the touch electrode layer is provided with the sub-main 500, while another portion of the mesh holes 400*a* may not be provided with the sub-main 500. The mesh holes 400*a* provided with the sub-main 500 need to be uniformly distributed in the touch electrode layer 400. In this way, the plurality of auxiliary partition openings 500*a* in the display panel 000 may be uniformly distributed in the touch electrode layer 400.

In the embodiments of the present disclosure, as the reflectivity of the auxiliary partition openings 500*a* of the sub-main 500 to the ambient light is approximately equal to the reflectivity of the partition openings 400*b* in the touch electrode layer 400 to the ambient light, and the plurality of auxiliary partition openings 500*a* in the display panel 000 can be uniformly distributed in the touch electrode layer 400. Therefore, when the display panel 000 does not display an image and is irradiated by the ambient light, the probability of presentation of mesh-shaped dark lines on the display panel 000 can be effectively reduced, thereby improving the reliability of the display panel 000.

In addition, the present disclosure provides an additional sub-main 500 with an auxiliary partition opening 500*a* in the mesh hole 400*a*, and does not additionally provide partition openings in the touch driving electrodes 401 and the touch sensing electrodes 402 in the touch electrode layer 400. In this way, the resistance of the touch driving electrodes 401 and the resistance of the touch sensing electrodes 402 are not increased, such that the touch effect of the display panel 000 is not affected, thereby further improving the reliability of the display panel 000.

In summary, a display panel provided by the embodiments of the present disclosure includes a driver backplane, a plurality of light-emitting devices, an encapsulation layer, a touch electrode layer, and sub-mains. As the reflectivity of an auxiliary partition opening of the sub-main to the ambient light is approximately equal to the reflectivity of the partition opening in the touch electrode layer to the ambient light, and the plurality of auxiliary partition openings in the display panel can be uniformly distributed in the touch electrode layer. Therefore, when the display panel does not display an image and is irradiated by ambient light, the probability of presentation of mesh-shaped dark lines on the display panel can be effectively reduced, thereby improving the reliability of the display panel. In addition, the present disclosure provides an additional sub-main with an auxiliary partition opening in the mesh hole, and does not additionally provide partition openings in the touch driving electrodes and the touch sensing electrodes in the touch electrode layer. In this way, the resistance of the touch driving electrodes and the resistance of the touch sensing electrodes are not increased, such that the touch effect of the display panel is affected, thereby further improving the reliability of the display panel.

Figure 8:
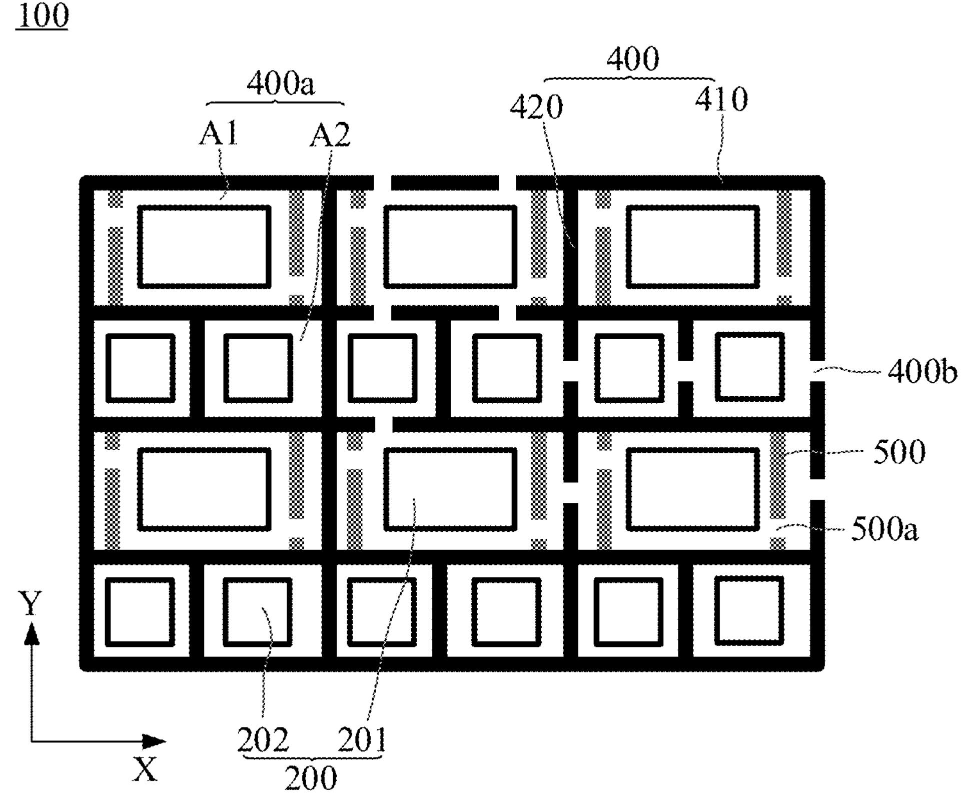
FIG. 8 is a partial top view of another display panel according to some embodiments of the present disclosure.

In the embodiments of the present disclosure, referring to FIG. 8, FIG. 8 is a partial top view of another display panel according to some embodiments of the present disclosure. The touch electrode layer 400 in the display panel 000 may include: a plurality of first main lines 410 extending along a first direction X and a plurality of second main lines 420 extending along a second direction Here, the first direction X is a column arrangement direction of the plurality of light-emitting devices 200, and the second direction Y is a row arrangement direction of the plurality of light-emitting devices 200. The plurality of first main lines 410 may be arranged in parallel and all extend along the first direction X, and the plurality of second main lines 420 may be arranged in parallel and all extend along the second direction Y. That is, in the accompanying drawings of the present disclosure, the horizontal lines are the first main lines 410 and the vertical lines are the second main lines 420.

Therefore, the plurality of first main lines 410 and the plurality of second main lines 420 are configured to enclose the plurality of mesh holes 400*a* in the touch electrode layer 400. Exemplarily, two adjacent first main lines 410 and two adjacent second main lines 420 can enclose one rectangular frame with the mesh holes 400*a*, and the orthographic projection of each of the light-emitting devices 200 on the driver backplane 100 can be disposed in a region enclosed by an orthographic projection of the rectangular frame on the driver backplane 100.

In the present disclosure, the touch driving electrodes 401 and the touch sensing electrodes 402 in the touch electrode layer 400 both include: a portion of the first main lines 410 and a portion of the second main lines 420. It should be noted that the first main lines 410 and the second main lines 420 may be arranged in the same layer and made of the same material. In order to ensure that there is no short circuit between the touch driving electrode 401 and the touch sensing electrode 402 distributed adjacent to each other, the plurality of partition openings 400*b* may be provided on both the first main lines 410 and the second main lines 420, such that the touch driving electrodes 401 and the touch sensing electrodes 402 arranged adjacently may be disconnected through the partition openings 400*b* of the first main lines 410 and/or the partition openings 400*b* of the second main lines 420.

In the embodiments of the present disclosure, the sub-mains 500 in the display panel 000 may be arranged in the same layer and made of the same material as the touch electrode layer 400. That is, the first main lines 410, the second main lines 420, and the sub-mains 500 are provided in the same layer and made of the same material. In this way, the first main lines 410, the second main lines 420, and the sub-mains 500 can be formed simultaneously through the same patterning process, which can effectively simplify the difficulty of preparing the display panel 000.

In some embodiments, the width of an orthographic projection of each of the mesh holes 400*a* distributed with the sub-main 500 on the driver backplane 100 in the first direction X is greater than that in the second direction Y. In this case, a distance between the light-emitting device 200 corresponding to the mesh hole 400*a* and the adjacent second main line 420 in the first direction X is greater than a distance between the light-emitting device 200 corresponding to the mesh hole 400*a* and the adjacent first main line 410 in the second direction Y. In order to ensure that the sub-main 500 does not block the light emitted by the light-emitting devices 200, it is necessary to ensure that the extension direction of the sub-main 500 is parallel to the extension direction of the second main lines 420. In this way, the sub-main 500 can be distributed between the second main lines 420 and the light-emitting device 200 in the first direction X. As the distance between the light-emitting device 200 and the adjacent second main line 420 is larger in the first direction X, it can be ensured that the sub-main 500 does not block the light emitted by the light-emitting device 200 in the case that the sub-main 500 is distributed between the light-emitting device 200 and the adjacent second main line 420.

In some embodiments, as shown in FIG. 8, in the first direction X, at least one second main line 420 and at least one sub-main 500 are distributed between two adjacent light-emitting devices 200.

Exemplarily, in the case that two sub-mains 500 disposed side by side are distributed between two adjacent light-emitting devices 200 in the first direction X, at least one second main line 420 distributed between the two adjacent light-emitting devices 200 are disposed between the two sub-mains 500 disposed side by side.

In some embodiments, in the first direction X, for two sub-mains 500 disposed side by side between two adjacent light-emitting devices 200, a position of the auxiliary partition opening 500*a* in one sub-main 500 is staggered with a position of the auxiliary partition opening 500*a* in the other sub-main 500. For example, in FIG. 8, the position of the auxiliary partition opening 500*a* in one sub-main 500 is disposed on an upper in the second direction Y, and the position of the auxiliary partition opening 500*a* in the other sub-main 500 is disposed on a lower side in the second direction Y. In this case, due to a small distance between the two sub-mains 500 disposed side by side, in the case that the positions of the auxiliary partition openings 500*a* in the two sub-mains 500 overlap in the first direction X, the display panel 000 may present a new dark line extending along the first direction X when the display panel 000 does not display an image and is irradiated by the ambient light. Therefore, in the case that the positions of the auxiliary partition openings 500*a* in the two sub-main 500 disposed side by side are staggered in the first direction X, the presentation of the dark line extending along the first direction X on the display panel 000 can be effectively avoided to further improve the reliability of the display panel 000.

In the embodiments of the present disclosure, as shown in FIG. 8, the plurality of light-emitting devices 200 in the display panel 000 may include a plurality of first-type light-emitting devices 201 and a plurality of second-type light-emitting devices 202. The plurality of first-type light-emitting devices 201 may be arranged in a plurality of columns along the first direction X and in a plurality of rows along the second direction Y, and the plurality of second-type light-emitting devices 202 may be arranged in a plurality of columns along the first direction X and a plurality of rows along the second direction Y. Exemplarily, the first direction X may be perpendicular to the second direction Y.

In the present disclosure, two second-type light-emitting devices 202 are distributed between two adjacent first-type light-emitting devices 201 in the second direction Y. The two second-type light-emitting devices 202 may be arranged in sequence along the first direction X, and are configured to emit light of a different color respectively. In one possible implementation, the first-type light-emitting devices 201 may be configured to emit green light, i.e., the first-type light-emitting devices 201 belongs to a portion of the green sub-pixels in the display panel 000; the two second-type light-emitting devices 202 distributed between two adjacent first-type light-emitting devices 201 in the second direction Y are configured to emit red light and blue light respectively, i.e., the two second-type light-emitting devices 202 belong to a portion of the red sub-pixels and the blue sub-pixels in the display panel 000, respectively.

In this case, in the first direction X, a distance between two adjacent first-type light-emitting devices 201 is greater than a distance between two adjacent second-type light-emitting devices 201. Also, as the plurality of mesh holes 400*a* in the touch electrode layer 400 include first-type mesh holes A1 corresponding to the first-type light-emitting devices 201 and second-type mesh holes A2 corresponding to the second-type light-emitting devices 202, a ratio of an area of an orthographic projection of the first-type light-emitting device 201 on the driver backplane 100 to an area of an orthographic projection of a corresponding first type-mesh hole A1 on the driver backplane 100, may be greater than a ratio of an area of an orthographic projection of the second-type light-emitting device 202 on the driver backplane 100 to the area of an orthographic projection of a corresponding second-type mesh hole A2 on the driver backplane 100. Thus, in the first direction X, the distance between the first-type light-emitting device 201 and the first-type mesh hole A1 is greater than the distance between the second-type mesh hole 202 and the second-type light-emitting device A2.

In the present disclosure, the sub-main 500 in the display panel 000 may be distributed in the first-type mesh hole A1. Exemplarily, at least one sub-main 500 is distributed in each of the first-type mesh holes A1 in the touch electrode layer 400. In this way, it can be ensured that a certain distance exists between the sub-main 500 and the first-type light-emitting device 201 in the first direction X under the premise that the sub-main 500 can be embedded smoothly in the touch electrode layer 400, so as to ensure that the sub-main 500 does not block the light emitted from the light-emitting device 200.

It should be noted that both the first-type mesh hole A1 and the second-type mesh hole A2 are enclosed by the plurality of first main lines 410 and the plurality of second main lines 420. That is, two second main lines 420 are distributed on both sides of the first-type mesh hole A1 in the first direction X and two first main lines 410 are distributed on both sides of the first-type mesh hole A1 in the second direction Y. Similarly, in the first direction X, two second main lines 420 are distributed on both sides of the second-type mesh hole A2; and in the second direction Y, two first main lines 410 are distributed on both sides of the second-type mesh hole A2.

In the embodiments of the present disclosure, the plurality of first-type light-emitting devices 201 in the display panel 000 have a variety of arrangement directions, and in different arrangement modes, the structure of the sub-main 500 distributed in the first-type mesh hole A1 is also different. Therefore, the embodiments of the present disclosure will be described by taking the following two possible implementation modes as examples:

In a first possible implementation, as shown in FIG. 8, a plurality of first-type light-emitting devices 201 in a row of first-type light-emitting devices 201 in the display panel 000 are distributed at equal intervals. That is, the distance between any two adjacent first-type light-emitting devices 201 in the row of first-type light-emitting devices 201 is equal. Exemplarily, in the process of preparing the display panel 000, when the light-emitting layer in the first-type light-emitting device 201 is made by an evaporation process, each evaporation opening in the mask plate used in the evaporation process can correspond to one first-type light-emitting device 201, so as to evaporate the light-emitting layer in the corresponding first-type light-emitting device 201 through the evaporation opening.

In this case, at least one second main line 420 and at least one sub-main 500 are distributed between every two adjacent first-type light-emitting devices 201 in the first direction X. It should be noted that in the first direction X, the number of the sub-mains 500 distributed between two adjacent first-type light-emitting devices 201 may be one or two. Therefore, the embodiments of the present disclosure are shown with the following two cases as examples.

In a first case, as shown in FIG. 8, in the case that two sub-mains 500 distributed side by side between two adjacent first-type light-emitting devices 201 in the first direction X, at least one second main line 420 distributed between the two adjacent first-type light-emitting devices 201 are disposed between the two sub-mains 500 side by side.

In this case, two sub-mains 500 are distributed in the same first-type mesh hole A1, and the first-type light-emitting device 201 corresponding to the first-type mesh hole A1 is distributed between the two sub-mains 500 in the first direction X. Exemplarily, for the two sub-mains 500 distributed in the same first-type mesh hole A1, in the first direction X, the distances between the two sub-mains 500 and the first-type light-emitting device 201 disposed therebetween are equal and the distances between the sub-main 500 and the second main lines 420 distributed adjacently are equal.

In some embodiments, in the first direction X, for the two sub-mains 500 disposed side by side between two adjacent first-type light-emitting devices 201, a position of the auxiliary partition opening 500*a* in one sub-main 500 is staggered with a position of the auxiliary partition opening 500*a* in the other sub-main 500.

Figure 9:
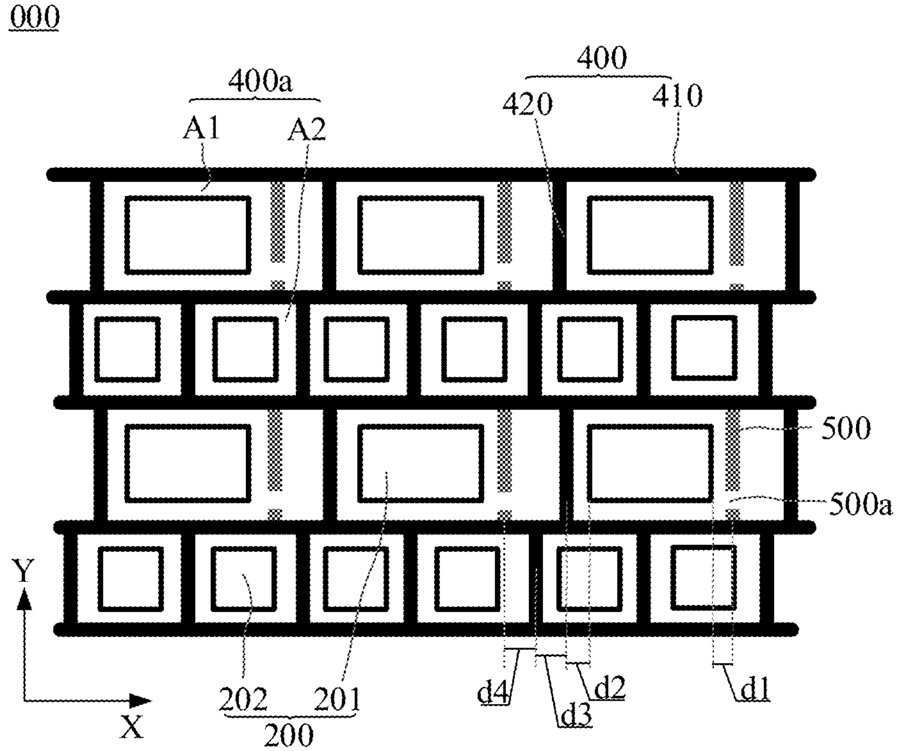
FIG. 9 is a partial top view of yet another display panel according to some embodiments of the present disclosure.

In a second case, as shown in FIG. 9, FIG. 9 is a partial top view of yet another display panel according to some embodiments of the present disclosure. In the case that one sub-main 500 and one second main line 420 are distributed between two adjacent first-type light-emitting devices 201 in the first direction X, the sub-main 500 and the second main line 420 may be alternately arranged in the first direction X. That is, in the first direction X, one second main line 420 is distributed between two adjacent sub-mains 500, and one sub-main 500 is also distributed between two adjacent second main lines 420.

In this case, one sub-main 500 is distributed in the same first-type mesh hole A1. Exemplarily, in the first direction, both sides of the sub-main 500 are disposed one second main line 420 for forming the first-type mesh hole A1 and the first-type light-emitting device 201 corresponding to the first-type mesh hole A1, and a distance d1 between the sub-main 500 and the first-type light-emitting device 201 is equal to a distance d2 between the first-type light-emitting device 201 and the other second main line 420 configured to form the first-type mesh hole A1.

In some embodiments, as shown in FIG. 9, in the first direction X, the second main line 420 between the two adjacent first-type light-emitting devices 201 may be staggered with the second main line 420 between the two adjacent second-type light-emitting devices 202, and a distance d3 between the second main line 420 between the two adjacent first-type light-emitting devices 201 and the second main line 420 between the two adjacent second-type light-emitting devices 202 is equal to a distance d4 between the sub-main 500 between the two adjacent first-type light-emitting devices 201 and the second main line 420 between the two adjacent second-type light-emitting devices 202. In this way, the second main lines 420 and the sub-mains 500 in the touch electrode layer 400 can be ensured to be uniformly distributed.

Figure 10:
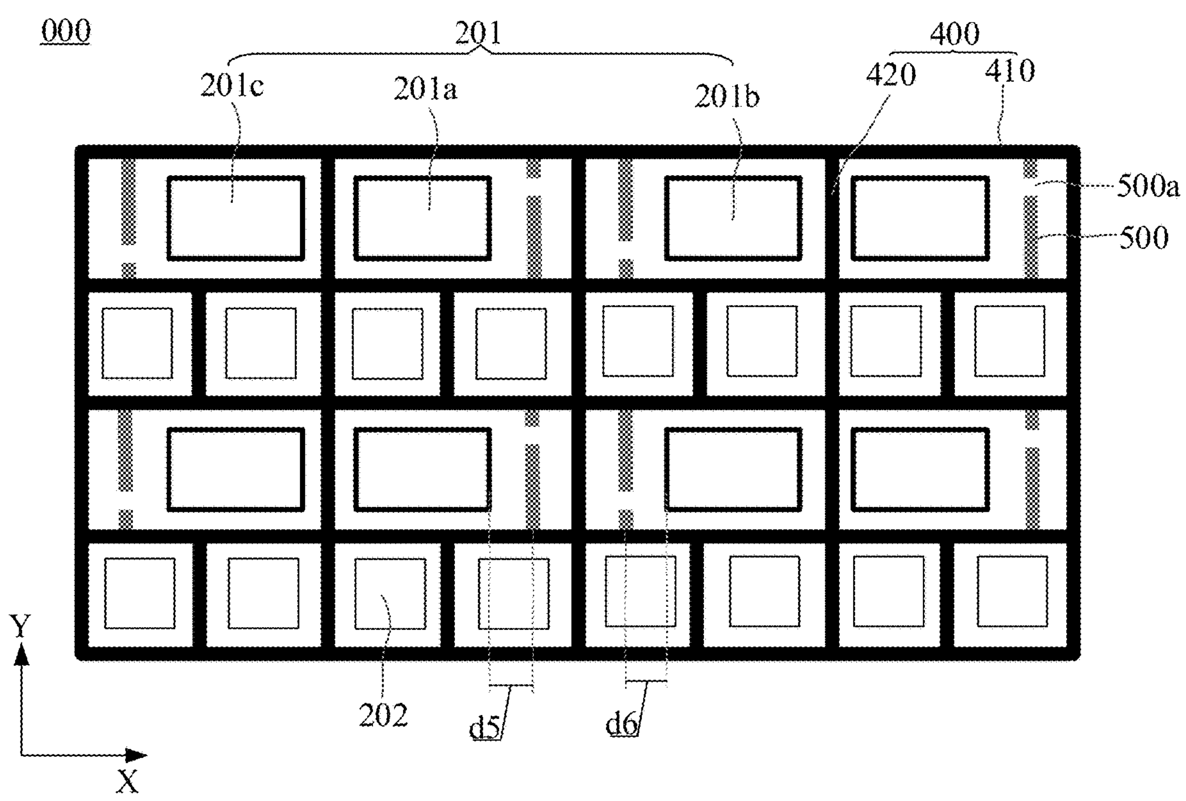
FIG. 10 is a partial top view of a display panel according to other embodiments of the present disclosure.

In a second possible implementation, as shown in FIG. 10, FIG. 10 is a partial top view of a display panel according to other embodiments of the present disclosure. In a row of first-type light-emitting devices 201 in the display panel 000, a distance between a first sub-light-emitting device 201*a* and a second sub-light-emitting device 201*b* is greater than a distance between the first sub-light-emitting device 201*a* and a third sub-light-emitting device 201*c*. The first sub-light-emitting device 201*a* is any of the first-type light-emitting devices in the row of first-type light-emitting devices 201, and the second sub-light-emitting device 201*b* and the third sub-light-emitting device 201*c* are the two first-type light-emitting devices in the row of first-type light-emitting devices 201 that are adjacent to the first sub-light-emitting device 201*a*. Exemplarily, in the preparation process of the display panel 000, when the light-emitting layer in the first-type light-emitting device 201 is made by the evaporation process, each evaporation opening in the mask plate used in the evaporation process may correspond to two adjacent first-type light-emitting devices 201, so as to evaporate the light-emitting layer in the corresponding two first-type light-emitting devices 201 through the vaporization opening. Here, the light-emitting layers in the second sub-light-emitting device 201*b* and the third sub-light-emitting device 201*c* may be evaporated through the same evaporation opening.

In this case, the distance between the first sub-light-emitting device 201*a* and the second sub-light-emitting device 201*b* in the first direction X is larger. At least one second main line 420 and at least one sub-main 500 may be distributed between the first sub-light-emitting device 201*a* and the second sub-light-emitting device 201*b* in the first direction X. The distance between the first sub-light-emitting device 201*a* and the third sub-light-emitting device 201*c* in the first direction X is smaller, and only one second main line 420 may be distributed between the first sub-light-emitting device 201*a* and the third sub-light-emitting device 201*c* in the first direction X.

Exemplarily, two sub-mains 500 are distributed between the first sub-light-emitting device 201*a* and the second sub-light-emitting device 201*b* in the first direction X. At least one second main line 420 distributed between the first sub-light-emitting device 201*a* and the second sub-light-emitting device 201*b* in the first direction X is disposed between the two sub-mains 500. In this case, in the two sub-mains 500, a distance d5 between one sub-main 500 and the first sub-light-emitting device 201*a* in the first direction X is equal to a distance d6 between the other sub-main 500 and the second sub-light-emitting device 201*b* in the first direction X.

In some embodiments, in the first direction X, for the two sub-mains 500 disposed between the first sub-light-emitting device 201*a* and the second sub-light-emitting device 201*b*, a position of the auxiliary partition opening 500*a* in one sub-main 500 is staggered with a position of the auxiliary partition opening 500*a* in the other sub-main 500 in the first direction X. It should be noted that the purpose of such a design can refer to the corresponding content in the first possible implementation described above, which will not be repeated here.

In the present disclosure, there are various cases in which the number of the second main lines 420 distributed between the first sub-light-emitting device 201*a* and the second sub-light-emitting device 201*b* in the first direction X. Therefore, the embodiments of the present disclosure are shown with the following three cases as examples.

In a first case, as shown in FIG. 10, in the first direction X, in the case that the number of the second main lines 420 distributed between the first sub-light-emitting device 201*a* and the second sub-light-emitting device 201*b* is one, the second main line 420 may be co-linear with the second main line 420 between two adjacent second-type light-emitting devices 202.

Figure 11:
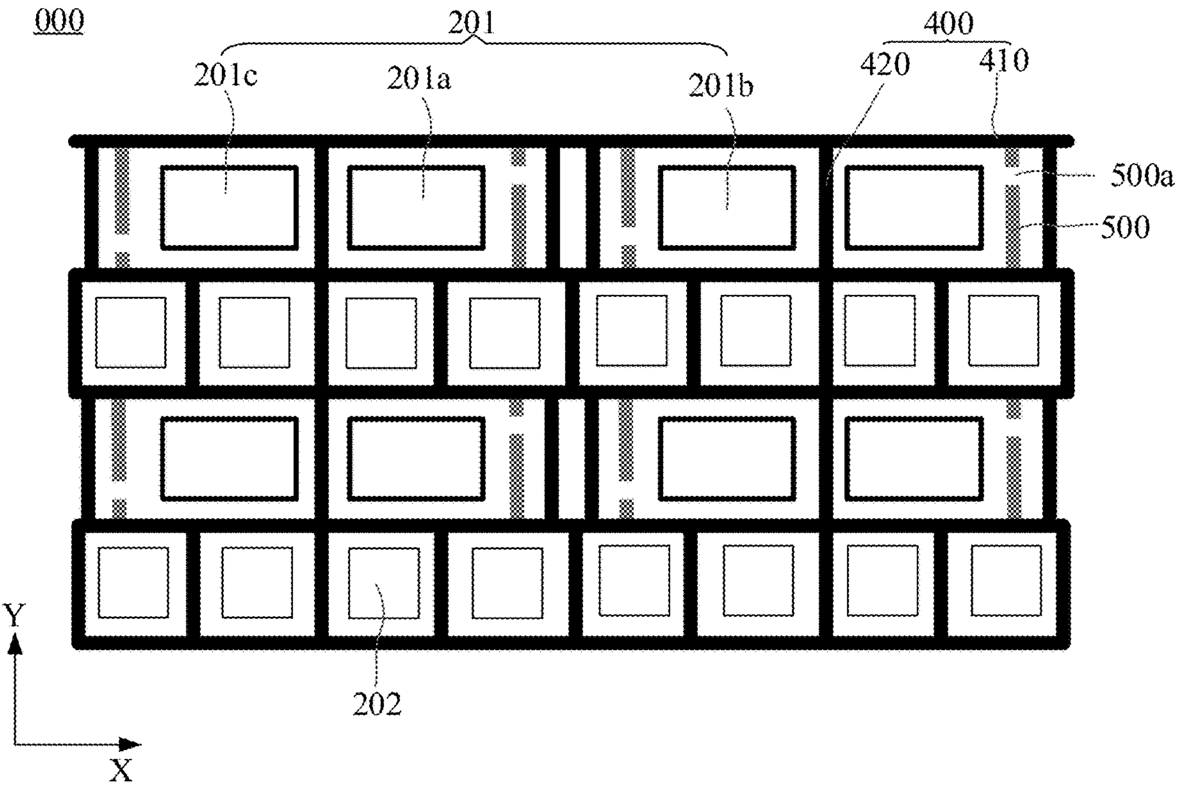
FIG. 11 is a partial top view of another display panel according to other embodiments of the present disclosure.

In the second case, as shown in FIG. 11, FIG. 11 is a partial top view of another display panel according to other embodiments of the present disclosure. In the first direction X, in the case that the number of the second main lines 420 distributed between the first sub-light-emitting device 201*a* and the second sub-light-emitting device 201*b* is two, the two second main lines 420 may be staggered with the second main line 420 between two adjacent second-type light-emitting devices 202.

Figure 12:
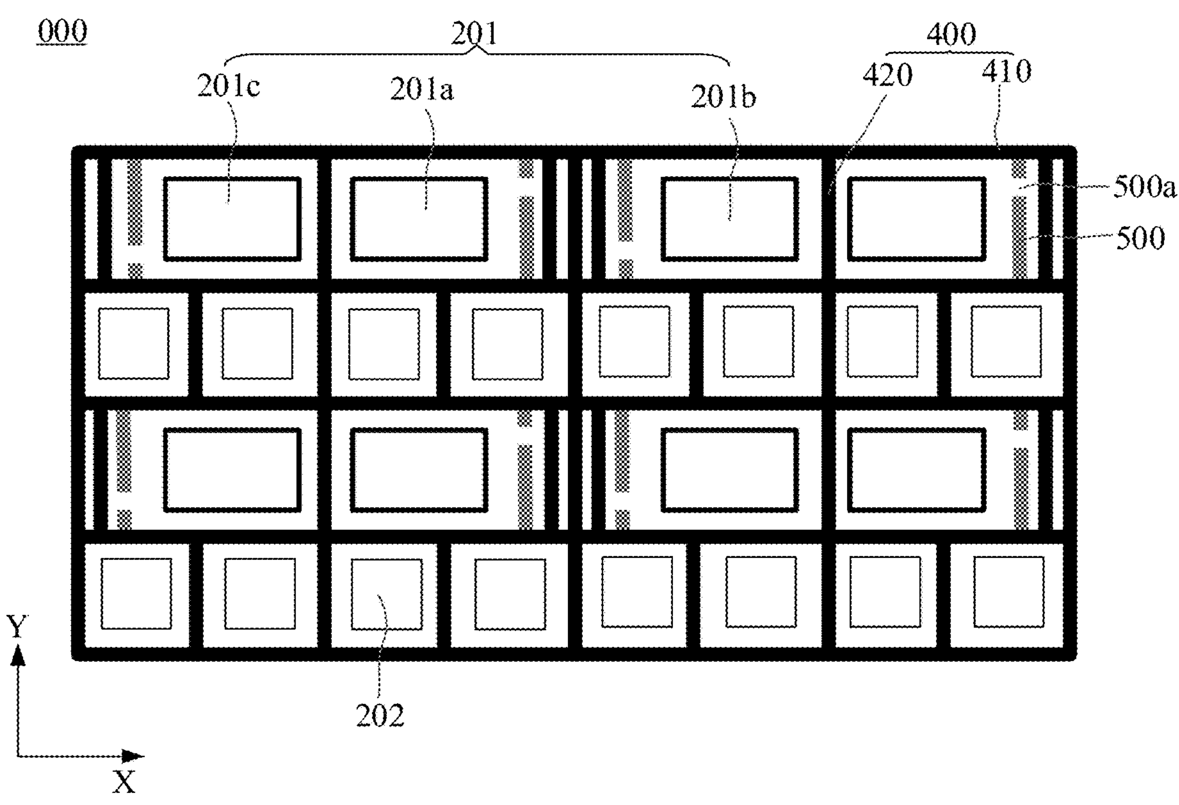
FIG. 12 is a partial top view of yet another display panel according to other embodiments of the present disclosure.

In the third case, as shown in FIG. 12, FIG. 12 is a partial top view of yet another display panel according to other embodiments of the present disclosure. In the first direction X, in the case that the number of the second main lines 420 distributed between the first sub-light-emitting device 201*a* and the second sub-light-emitting device 201*b* is three, the second main line 420 in the middle of the three second main lines 420 can be co-linear with the second main line 420 between the two adjacent second-type light-emitting devices 202, and the other two of the three second main lines 420 may be staggered with the second main line 420 between the two adjacent second-type light-emitting devices 202.

It should be noted that in the case that the number of the second main lines 420 distributed between the first sub-light-emitting device 201*a* and the second sub-light-emitting device 201*b* is multiple, e.g., in the second case or the third case described above, the resistances of the touch driving electrode 401 and the touch sensing electrode 402 in the touch electrode layer 400 may be further reduced.

It should also be noted that in the above three cases, in the first direction X, the second main line 420 and the sub-main 500 between the first sub-light-emitting device 201*a* and the second sub-light-emitting device 201*b* may be distributed at equal intervals.

Figure 13:
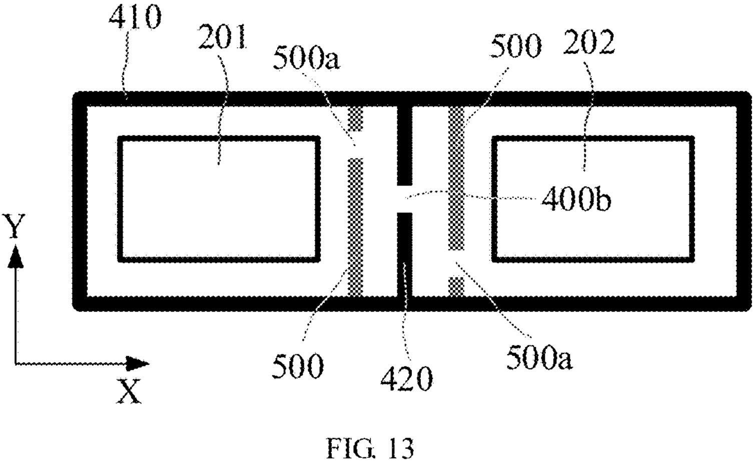
FIG. 13 is a partial top view of yet another display panel according to other embodiments of the present disclosure.

For the first possible implementation and the second possible implementation described above, the second main line 420 has a partition opening 400*b* at the intersection of the touch driving electrode 401 and the touch sensing electrode 402 disposed adjacently in the touch electrode layer 400, and the second main line 420 with the partition opening 400*b* may be disposed adjacently to the sub-main 500. In this case, as shown in FIG. 13, FIG. 13 is a partial top view of yet another display panel according to other embodiments of the present disclosure, when the second main line 420 disposed adjacently to the sub-main 500 in the first direction X has a partition opening 400*b*, a position of the partition opening 400*b* of the second main line 420 is staggered with the position of the auxiliary partition opening 500*a* of the sub-main 500 in the first direction. It should be noted that the purpose of such a design is the same as the purpose of staggering the positions of the auxiliary partition openings 500*a* of the two sub-mains 500 in the first direction X in the embodiment described above, and will not be repeated herein.

Figure 14:
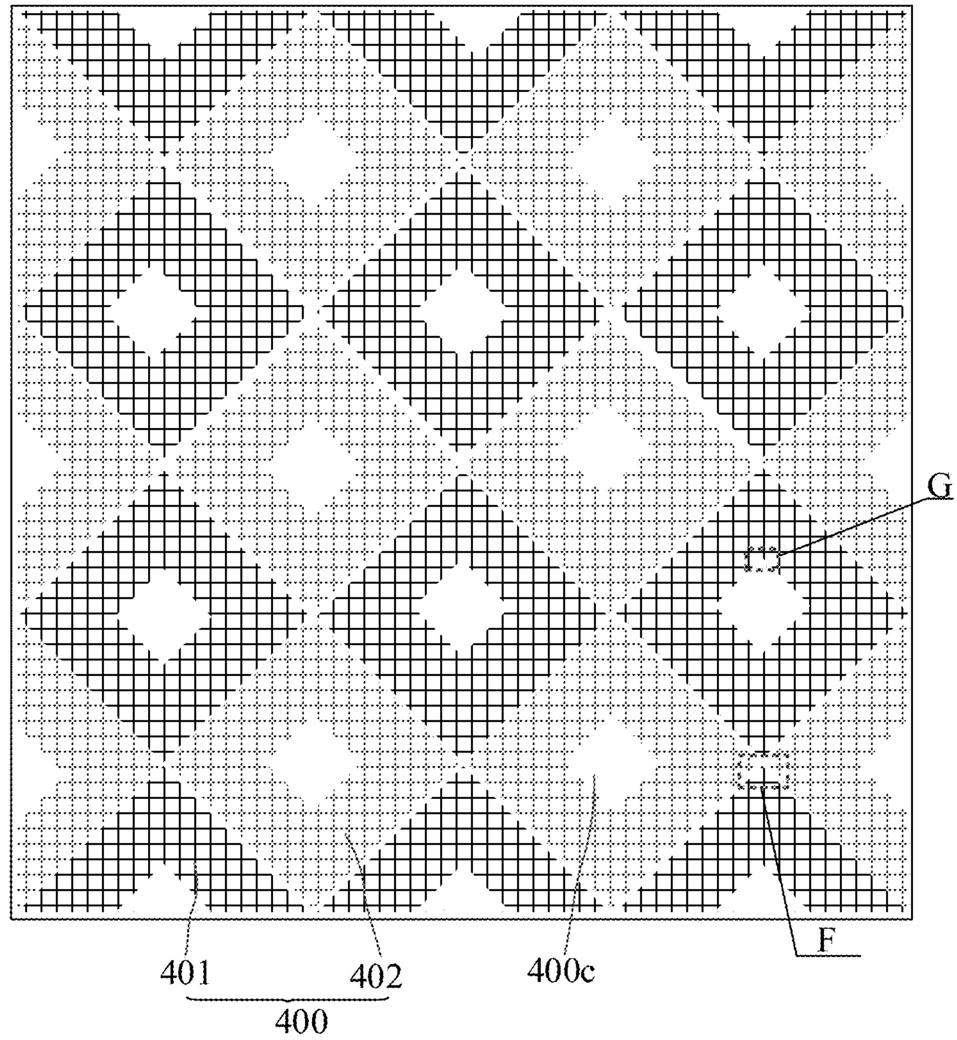
FIG. 14 is a top view of a display panel according to yet other embodiments of the present disclosure.
Figure 15:
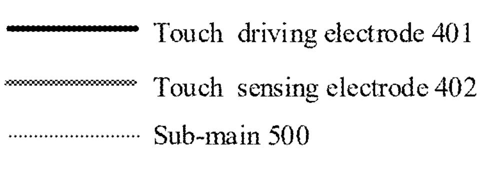
FIG. 15 is a partial enlarged view of the display panel shown at position F in FIG. 14.
Figure 15:
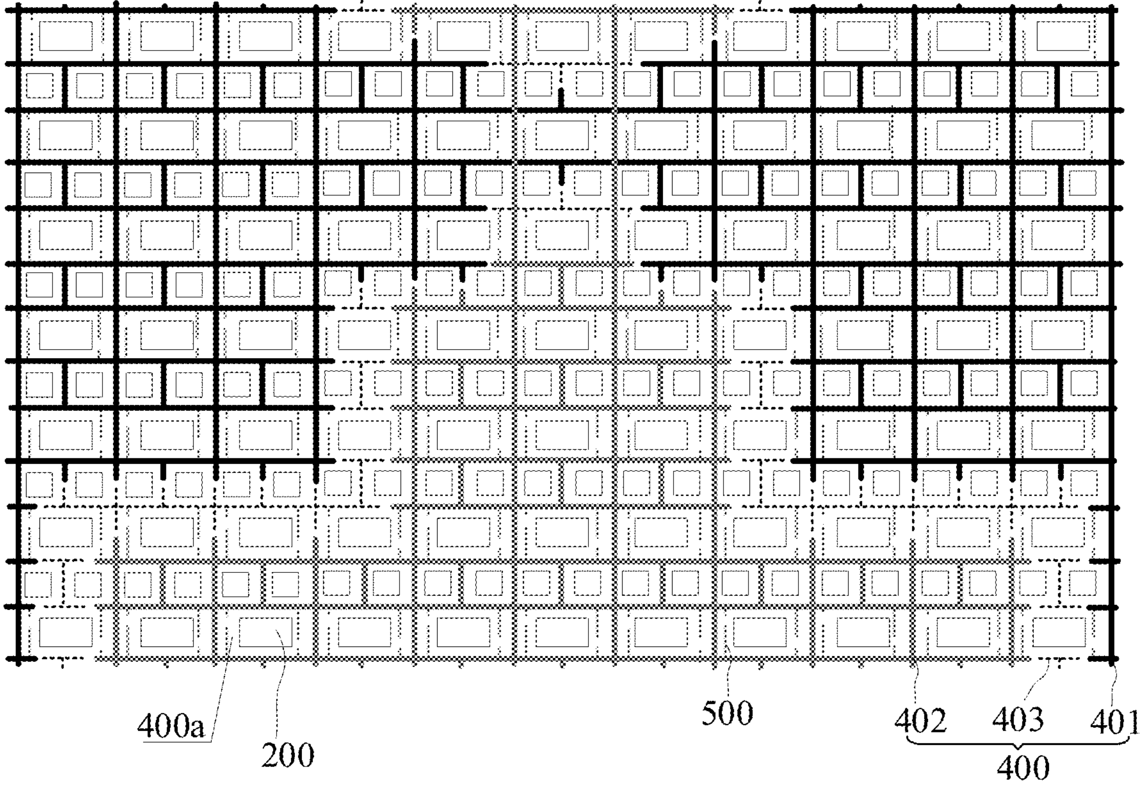

In some embodiments, as shown in FIG. 14 and FIG. 15, FIG. 14 is a top view of a display panel according to yet other embodiments of the present disclosure, and FIG. 15 is a partial enlarged view of the display panel shown in FIG. 14 at F. The touch electrode layer 400 may include not only touch driving electrode 401 and touch sensing electrode 402, but also a first virtual electrode 403 disposed between the touch driving electrode 401 and the touch sensing electrode 402 that are adjacently distributed. Here, the first virtual electrode 403 may include a portion of the first main line 410 and a portion of the second main line 420, and the first virtual electrode 403 may be disconnected to the touch driving electrode 401 through the partition openings 400*b* of the first main lines 410 and/or the partition openings 400*b* of the second main lines 420, and the first virtual electrode 403 may be disconnected to the touch sensing electrode 402 through the partition openings 400*b* of the first main lines 410 and/or the partition openings 400*b* of the second main lines 420.

In this case, by providing the first virtual electrode 403 between the touch driving electrode 401 and the touch sensing electrode 402 adjacently distributed, the distance between the touch driving electrode 401 and the touch sensing electrode 402 can be effectively increased, such that the mutual capacitance generated therebetween is smaller, thereby effectively improving the touch effect of the display panel 000.

Figure 16:
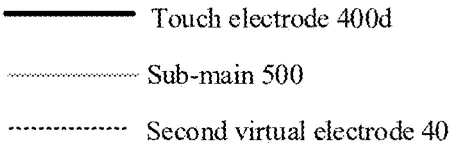
FIG. 16 is a partial enlarged view of the display panel shown at position G in FIG. 14.
Figure 16:
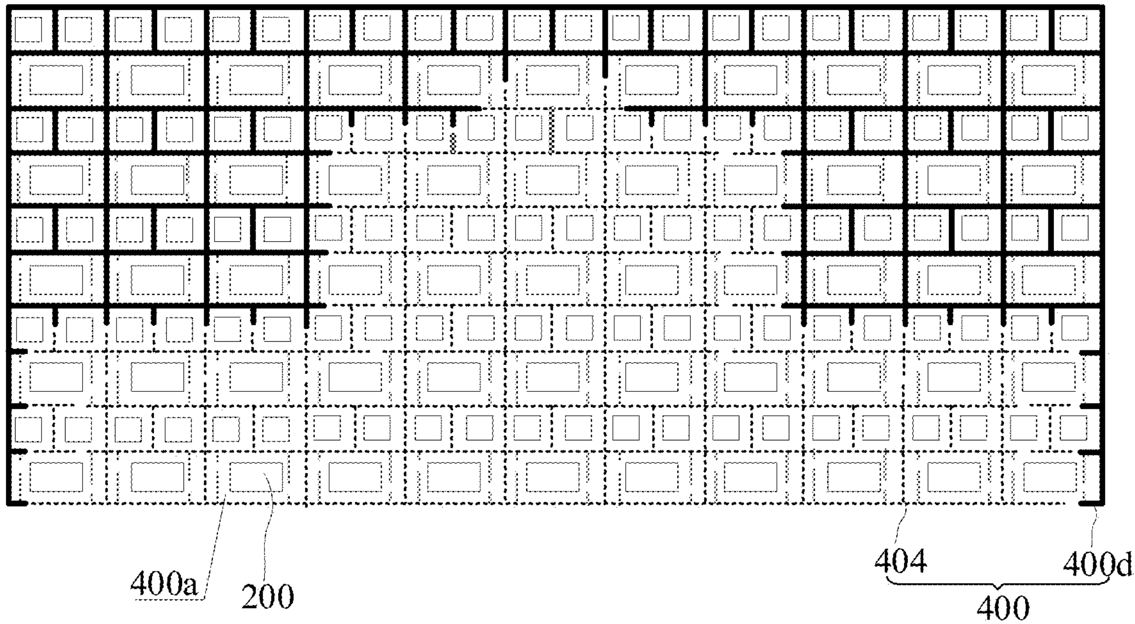

In some embodiments, as shown in FIG. 16, FIG. 16 is a partial enlarged view of the display panel shown at position G in FIG. 14. Each touch electrode 400*d* of the touch driving electrodes 401 and the touch sensing electrodes 402 in the touch electrode layer 400 has an isolation region 400*c*. The touch electrode layer 400 may further include a second virtual electrode 404 disposed in the isolation region 400*c*. The second virtual electrode 404 may include a portion of the first main line 410 and a portion of the second main line 420. The second virtual electrode 404 is disconnected to the touch electrode 400*d* (i.e., the touch driving electrode 401 or the touch sensing electrode 402) through the partition openings 400*b* of the first main lines 410 and/or the partition openings 400*b* of the second main lines 420.

In this case, by providing the isolation region 400*c* in each touch electrode 400*d*, the coupling capacitance between the touch electrode 400*d* and the electrode layer (e.g., a cathode layer) in the display panel 000 can be effectively reduced, so as to further improve the touch effect of the display panel 000. In addition, by providing the second virtual electrode 404 in the isolation region 400*c*, it can be ensured that the touch electrode layer 400 in the display panel 000 is uniformly distributed, and further it can be ensured that the reflectivity of various regions of the display panel 000 can be approximately equal, so as to further improve the reliability of the display panel 000.

In the embodiments of the present disclosure, in the touch electrode layer 400 of the display panel 000, the plurality of touch driving electrodes 401 may be arranged in a plurality of rows, and two adjacent touch driving electrodes 401 in each row of the touch driving electrodes 401 may be connected by a first signal line. Similarly, the plurality of touch sensing electrodes 401 may be arranged in a plurality of columns, and two adjacent touch sensing electrodes 401 in each column of the touch sensing electrodes 401 may be connected by a second signal line. Here, one of the first signal line and the second signal line may be arranged in the same layer and made of the same material as the touch driving electrode 401 and the touch sensing electrode 402, and the other of the first signal line and the second signal line may be a bridge signal line, which is arranged in a different layer from the touch electrode layer 400, and the first signal line and the second signal line need to be insulated at the intersection. In this way, the short circuit phenomenon occurring at the intersection of a row of touch driving electrodes 401 and a column of touch sensing electrodes 402 can be effectively avoided.

Figure 17:
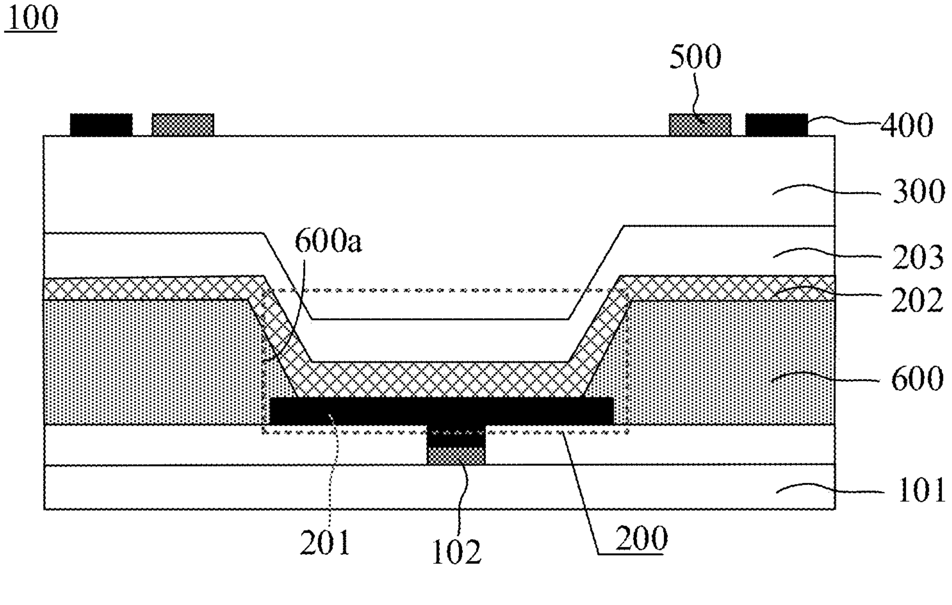
FIG. 17 is a schematic diagram of a film layer structure of another display panel according to yet other embodiments of the present disclosure.

In some embodiments, as shown in FIG. 17, FIG. 17 is a schematic diagram of a film layer structure of another display panel according to yet other embodiments of the present disclosure. The display panel 000 may further include a pixel definition layer 600 disposed on a side of the driver backplane 100. The pixel definition layer 600 may be provided with a plurality of pixel openings 600*a* in one-to-one correspondence with the plurality of light-emitting devices 200, and each of the light-emitting devices 200 may be disposed in the corresponding pixel opening 600*a*.

Exemplarily, the display panel 000 may include an anode layer, a light-emitting layer 202, and a cathode layer 203 which are stacked on a side of the driver backplane 100. The anode layer may be disposed on a side of the pixel definition layer 600 close to the driver backplane 100, and both the light-emitting layer 202 and the cathode layer 203 may be disposed on a side of the pixel definition layer 600 facing away from the driver backplane 100. Here, the anode layer may include a plurality of anode blocks 201 in one-to-one correspondence with the plurality of pixel openings 600*a*, and an orthographic projection of each anode block 201 on the driver backplane 100 may fall into an orthographic projection of the corresponding pixel opening 600*a* on the driver backplane 100. It is noted that the anode block 201 corresponding to a certain pixel hole 600*a*, a portion of the light-emitting layer 202 disposed in this pixel opening 600*a*, and a portion of the cathode layer 203 disposed in the pixel opening 600*a* can form the light-emitting device 200 corresponding to the pixel opening 600*a*.

In the embodiments of the present disclosure, the orthographic projection of the touch electrode layer 400 on the driver backplane 100 and the orthographic projection of the sub-main 500 on the driver backplane 100 both fall into the orthographic projection of the pixel definition layer 600 on the driver backplane 100. In this way, it can be ensured that neither the touch electrode layer 400 nor the sub-main 500 blocks the light emitted from the light-emitting device 200.

In some embodiments, the driver backplane 100 in the display panel 000 may include a substrate 101, and a plurality of pixel driving circuits 102 disposed on a side of the substrate 101. The plurality of pixel driving circuits 102 may be electrically connected in one-to-one correspondence with the plurality of light-emitting devices 200 in the display panel 000. For example, each pixel driving circuit 102 may be electrically connected to an anode block 201 in the corresponding light-emitting device 200. Each pixel driving circuit 102 is configured to drive the corresponding light-emitting device to emit light, and the plurality of pixel driving circuits 101 are closer to the substrate 101 relative to the plurality of light-emitting devices.

In summary, a display panel provided by the embodiments of the present disclosure includes a driver backplane, a plurality of light-emitting devices, an encapsulation layer, a touch electrode layer, and sub-mains. As the reflectivity of an auxiliary partition opening of the sub-main to the ambient light is approximately equal to the reflectivity of the partition opening in the touch electrode layer to the ambient light, and the plurality of auxiliary partition openings in the display panel can be uniformly distributed in the touch electrode layer. Therefore, when the display panel does not display an image and is irradiated by ambient light, the probability of presentation of mesh-shaped dark lines on the display panel can be effectively reduced, thereby improving the reliability of the display panel. In addition, the present disclosure provides an additional sub-main with an auxiliary partition opening in the mesh hole, and does not additionally provide partition openings in the touch driving electrodes and the touch sensing electrodes in the touch electrode layer. In this way, the resistance of the touch driving electrodes and the resistance of the touch sensing electrodes are not increased, such that the touch effect of the display panel is affected, thereby further improving the reliability of the display panel.

The embodiments of the present disclosure also provide a display device. The display device may be any other product or component with a display function, such as a mobile phone, a tablet computer, a television, a monitor, a laptop computer, a digital photo frame, a navigator, and the like. The display device may include a power supply component, and a display panel electrically connected to the power supply component. The display panel may be the display panel in the above embodiments.

It should be noted that in the accompanying drawings, the sizes of the layers and regions may be exaggerated for the clarity of the illustrations. It is also understood that when an element or layer is referred to as being "on" another element or layer, it may be directly on the other element, or there may be an intermediate layer. Also, it is understood that when the element or layer is referred to as being "under" another element or layer, it can be directly under the other element, or there may be more than one intermediate layer or element. It is also understood that when a layer or element is referred to as being "between" two layers or elements, it may be the only layer between the two layers or elements, or there may also be more than one intermediate layer or element. Similar reference numerals throughout indicate similar elements.

In the present disclosure, the terms "first" and "second" are used for descriptive purposes only and are not to be understood as indicating or implying relative importance. The term "a plurality of" refers to two or more than two, unless otherwise clearly defined.

The above description is only an optional embodiment of the present disclosure and is not intended to limit the present disclosure, and any modifications, equivalent substitutions, improvements, and the like, made within the spirit and principles of this present disclosure shall be included in the scope of protection of the present disclosure.

The invention claimed is:

1. A display panel, comprising:

a driver backplane;

a plurality of light-emitting devices disposed in an array on a side of the driver backplane;

an encapsulation layer disposed on a side of the plurality of light-emitting devices facing away from the driver backplane;

a touch electrode layer disposed on a side of the encapsulation layer facing away from the driver backplane, wherein the touch electrode layer is provided with a plurality of mesh holes in one-to-one correspondence with the plurality of light-emitting devices, an orthographic projection of each of the plurality of light-emitting devices on the driver backplane falls into an orthographic projection of a corresponding mesh hole on the driver backplane, and the touch electrode layer comprises a plurality of first main lines extending along a first direction and a plurality of second main lines extending along a second direction, wherein the plurality of first main lines and the plurality of second main lines are configured to enclose the plurality of mesh holes, the first direction being a column arrangement direction of the plurality of light-emitting devices, and the second direction being a row arrangement direction of the plurality of light-emitting devices; and a sub-main distributed in at least one of the plurality of mesh holes, wherein at least one end of the sub-main is connected to an inner wall of a mesh hole in which the sub-main is disposed, the sub-main is provided with an auxiliary partition opening, and a width of an orthographic projection of each mesh hole distributed with the sub-main on the driver backplane in the first direction is greater than a width the orthographic projection of each mesh hole distributed with the sub-main on the driver backplane in the second direction, and an extension direction of the sub-main is parallel to an extension direction of each of the second main lines.

2. The display panel according to claim 1, wherein at least one of the second main lines and at least one sub-main are distributed between two adjacent light-emitting devices in the first direction.

3. The display panel according to claim 2, wherein two sub-mains disposed side by side are distributed between the two adjacent light-emitting devices in the first direction, and the at least one of the second main lines distributed between the two adjacent light-emitting devices are disposed between the two sub-mains disposed side by side.

4. The display panel according to claim 3, wherein in the two sub-mains disposed side by side, a position of an auxiliary partition opening in one of the two sub-mains is staggered with a position of an auxiliary partition opening in the other one of the two sub-mains in the first direction.

5. The display panel according to claim 1, wherein the plurality of light-emitting devices comprises a plurality of first-type light-emitting devices and a plurality of second-type light-emitting devices, and the plurality of mesh holes comprises first-type mesh holes corresponding to the first-type light-emitting devices and second-type mesh holes corresponding to the second-type light-emitting devices;

wherein a ratio of an area of an orthographic projection of each of the first-type light-emitting devices on the driver backplane to an area of an orthographic projection of a corresponding first-type mesh hole on the driver backplane, is greater than a ratio of an area of an orthographic projection of each of the second-type light-emitting devices on the driver backplane to an area of an orthographic projection of a corresponding second-type mesh hole on the driver backplane; and the sub-main is distributed in at least one of the first-type mesh holes.

6. The display panel according to claim 5, wherein a plurality of first-type light-emitting devices in a row of the first-type light-emitting devices are distributed at equal intervals, and in the first direction, at least one of the second main lines and at least one sub-main are distributed between every two adjacent first-type light-emitting devices.

7. The display panel according to claim 6, wherein in a case that one second main line and one sub-main are distributed between two adjacent first-type light-emitting devices in the first direction, a second main line between the two adjacent the first-type light-emitting devices in the first direction is staggered with a second main line between two adjacent second-type light-emitting devices, and a distance between the second main line between the two adjacent the first-type light-emitting devices and the second main line between the two adjacent the second-type light-emitting devices is equal to a distance between a sub-main between the two adjacent the first-type light-emitting devices and the second main line between the two adjacent the second-type light-emitting devices.

8. The display panel according to claim 1, wherein in the first direction, in a case that a second main line, adjacent to the sub-main, is provided with a partition opening, a position of the partition opening of the second main line is staggered with a position of an auxiliary partition opening of the sub-main.

9. The display panel according to claim 1, wherein the first main lines, the second main lines, and the sub-main are arranged in a same layer and made of a same material.

10. The display panel according to claim 1, wherein the touch electrode layer comprises a plurality of touch driving electrodes and a plurality of touch sensing electrodes, wherein each of the touch driving electrodes and the touch sensing electrodes comprises a portion of the first main lines and a portion of the second main lines, and the touch driving electrodes and the touch sensing electrodes which are adjacently arranged are disconnected through partition openings of the first main lines and/or partition openings of the second main lines.

11. The display panel according to claim 10, wherein the touch electrode layer further comprises a first virtual electrode disposed between the touch driving electrode and the touch sensing electrode which are adjacently arranged, wherein the first virtual electrode comprises a portion of the first main line and a portion of the second main line, and the first virtual electrode is disconnected to the touch driving electrode through the partition openings of the first main lines and/or the partition openings of the second main lines, and the first virtual electrode is disconnected to the touch sensing electrode through the partition openings of the first main lines and/or the partition openings of the second main lines.

12. The display panel according to claim 10, wherein each touch electrode in the touch driving electrodes and the touch sensing electrodes has an isolation region, and the touch electrodes layer further comprises a second virtual electrode disposed in the isolation region, wherein the second virtual electrode comprises a portion of the first main lines and a portion of the second main lines, and the second virtual electrode is disconnected to the touch electrode through the partition openings of the first main lines and/or the partition openings of the second main lines.

13. The display panel according to claim 1, further comprising: a pixel definition layer disposed on a side of the driver backplane, wherein the pixel definition layer is provided with a plurality of pixel openings in one-to-one correspondence with the plurality of light-emitting devices, each of the light-emitting devices being disposed in a corresponding pixel opening;

wherein both an orthographic projection of the touch electrode layer on the driver backplane and an orthographic projection of the sub-main on the driver backplane fall into an orthographic projection of the pixel definition layer on the driver backplane.

14. A display device, comprising: a power supply assembly and a display panel electrically connected to the power supply assembly, wherein the display panel comprises:

a driver backplane;

a plurality of light-emitting devices disposed in an array on a side of the driver backplane;

an encapsulation layer disposed on a side of the plurality of light-emitting devices facing away from the driver backplane;

a touch electrode layer disposed on a side of the encapsulation layer facing away from the driver backplane, wherein the touch electrode layer is provided with a plurality of mesh holes in one-to-one correspondence with the plurality of light-emitting devices, an orthographic projection of each of the plurality of light-emitting devices on the driver backplane falls into an orthographic projection of a corresponding mesh hole on the driver backplane, and the touch electrode layer comprises a plurality of first main lines extending along a first direction and a plurality of second main lines extending along a second direction, wherein the plurality of first main lines and the plurality of second main lines are configured to enclose the plurality of mesh holes, the first direction being a column arrangement direction of the plurality of light-emitting devices, and the second direction being a row arrangement direction of the plurality of light-emitting devices; and a sub-main distributed in at least one of the plurality of mesh holes, wherein at least one end of the sub-main is connected to an inner wall of a mesh hole in which the sub-main is disposed, the sub-main is provided with an auxiliary partition opening, and a width of an orthographic projection of each mesh hole distributed with the sub-main on the driver backplane in the first direction is greater than a width the orthographic projection of each mesh hole distributed with the sub-main on the driver backplane in the second direction, and an extension direction of the sub-main is parallel to an extension direction of each of the second main lines.

15. The display panel according to claim 5, wherein in a row of the first-type light-emitting devices, a distance between a first sub-light-emitting device and a second sub-light-emitting device is greater than a distance between the first sub-light-emitting device and a third sub-light-emitting device, the first sub-light-emitting device being any one of the first-type light-emitting devices in the row of the first-type light-emitting devices, and the second sub-light-emitting device and the third sub-light-emitting device in the row of the first-type light-emitting devices being two first-type light-emitting devices adjacent to the first sub-light emitting device; and in the first direction, at least one of the second main lines and at least one sub-main are distributed between the first sub-light-emitting device and the second sub-light-emitting device, and one of the second main lines is distributed between the second sub-light-emitting device and the third sub-light-emitting device.

16. The display panel according to claim 15, wherein in a case that one second main line and one sub-main are distributed between two adjacent first-type light-emitting devices in the first direction, a second main line between the two adjacent the first-type light-emitting devices in the first direction is staggered with a second main line between two adjacent second-type light-emitting devices, and a distance between the second main line between the two adjacent the first-type light-emitting devices and the second main line between the two adjacent the second-type light-emitting devices is equal to a distance between a sub-main between the two adjacent the first-type light-emitting devices and the second main line between the two adjacent the second-type light-emitting devices.

17. The display device according to claim 14, wherein at least one of the second main lines and at least one sub-main are distributed between two adjacent light-emitting devices in the first direction.

18. The display device according to claim 17, wherein two sub-mains disposed side by side are distributed between the two adjacent light-emitting devices in the first direction, and the at least one of the second main lines distributed between the two adjacent light-emitting devices are disposed between the two sub-mains disposed side by side.

* * * * *